(12) United States Patent
Harabe

(10) Patent No.: US 10,201,075 B2
(45) Date of Patent: Feb. 5, 2019

(54) IMAGE PROCESSING APPARATUS INCLUDING A PRINT BOARD INCLUDING A LAYERED BOARD AND A CYLINDRICAL MAGNETIC BODY

(71) Applicant: KYOCERA Document Solutions Inc., Osaka-shi, Osaka (JP)

(72) Inventor: Sho Harabe, Osaka (JP)

(73) Assignee: KYOCERA Document Solutions Inc., Osaka-shi, Osaka (JP)

( * ) Notice: Subject to any disclaimer, the term of this patent is extended or adjusted under 35 U.S.C. 154(b) by 0 days.

(21) Appl. No.: 16/011,914

(22) Filed: Jun. 19, 2018

(65) Prior Publication Data

US 2018/0376578 A1    Dec. 27, 2018

(30) Foreign Application Priority Data

Jun. 22, 2017   (JP) .................. 2017-122458

(51) Int. Cl.
| | |
|---|---|
| *G03G 15/00* | (2006.01) |
| *H05K 1/02* | (2006.01) |
| *H05K 3/00* | (2006.01) |
| *H05K 3/46* | (2006.01) |
| *H05K 3/40* | (2006.01) |
| *H05K 3/20* | (2006.01) |

(52) U.S. Cl.
CPC ........... *H05K 1/023* (2013.01); *H05K 3/0058* (2013.01); *H05K 3/20* (2013.01); *H05K 3/4069* (2013.01); *H05K 3/4614* (2013.01)

(58) Field of Classification Search
CPC ........... G03G 15/0863; G03G 21/1652; G03G 21/1867; G03G 21/1875
USPC ...................................... 399/12, 90
See application file for complete search history.

(56) References Cited

U.S. PATENT DOCUMENTS

2004/0012935 A1   1/2004   Tagi et al.
2007/0137890 A1   6/2007   Tagi et al.

FOREIGN PATENT DOCUMENTS

JP          200456144 A      2/2004

*Primary Examiner* — William J Royer
(74) *Attorney, Agent, or Firm* — Alleman Hall Creasman & Tuttle LLP

(57) ABSTRACT

In an image processing apparatus, a print board includes a layered board, frequency signal lines, and a cylindrical magnetic body. The frequency signal lines are formed on an intermediate layer of the layered board. The cylindrical magnetic body includes a lower portion, an upper portion, and a pair of side portions, wherein the lower portion and the upper portion are respectively formed on layers of the layered board that are, in a thickness direction of the print board, located under and on the intermediate layer on which the frequency signal lines are formed, and the pair of side portions connect the lower portion and the upper portion at opposite sides of the frequency signal lines. The cylindrical magnetic body is formed in a shape of a cylinder in such a way as to extend along the frequency signal lines and surround a circumference of the frequency signal lines.

5 Claims, 3 Drawing Sheets

IMAGE PROCESSING APPARATUS INCLUDING A PRINT BOARD INCLUDING A LAYERED BOARD AND A CYLINDRICAL MAGNETIC BODY

INCORPORATION BY REFERENCE

This application is based upon and claims the benefit of priority from the corresponding Japanese Patent Application No. 2017-122458 filed on Jun. 22, 2017, the entire contents of which are incorporated herein by reference.

BACKGROUND

The present disclosure relates to an image processing apparatus for reducing an EMI that is caused by a frequency signal line of a print board.

In general, an image processing apparatus that includes either or both of an image forming device and an image reading device, is provided with a print board that includes a frequency signal line through which a frequency signal is transmitted.

For example, the print board may include a modulation/demodulation circuit and an antenna, wherein the modulation/demodulation circuit is electrically connected to the frequency signal line, and the antenna is electrically connected to the modulation/demodulation circuit through the frequency signal line. In this case, the antenna transmits and receives a radio signal to and from an electronic tag attached to a toner container. The toner container stores toner that is supplied to the image forming device.

In addition, the print board may include a timing control circuit that is electrically connected to the frequency signal line. In this case, the timing control circuit, in accordance with a control command from a control device, outputs the frequency signal to the image reading device through the frequency signal line, so as to control timing of an image reading process.

Accordingly, in the image processing apparatus, it is required to reduce an EMI (Electro Magnetic Interference) that is caused by the frequency signal line of the print board.

In addition, there is known a technique where in the print board, auxiliary wiring that is electrically insulated from signal transmission wiring, is sandwiched between electromagnetic shielding layers that are respectively provided above and below the auxiliary wiring.

SUMMARY

An image processing apparatus according to an aspect of the present disclosure includes an image forming device or an image reading device, and a print board. The image forming device executes a print process of forming an image on a sheet. The image reading device executes an image reading process of reading an image from a document sheet. The print board includes a layered board and one or more frequency signal lines that are wiring patterns formed on an intermediate layer of the layered board. The print board transmits, through the one or more frequency signal lines, frequency signals concerning the print process or the image reading process. The print board further includes a cylindrical magnetic body. The cylindrical magnetic body includes a lower portion, an upper portion, and a pair of side portions, wherein the lower portion and the upper portion are respectively formed on layers of the layered board that are, in a thickness direction of the print board, located under and on the intermediate layer on which the one or more frequency signal lines are formed, and the pair of side portions connect the lower portion and the upper portion at opposite sides of the one or more frequency signal lines. The cylindrical magnetic body is formed in a shape of a cylinder in such a way as to extend along the one or more frequency signal lines and surround a circumference of the one or more frequency signal lines, and the cylindrical magnetic body is electrically insulated from the one or more frequency signal lines by the layered board.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The following describes an embodiment of the present disclosure with reference to the accompanying drawings. It should be noted that the following embodiment is an example of a specific embodiment of the present disclosure and should not limit the technical scope of the present disclosure.

Configuration of Image Processing Apparatus 10

An image processing apparatus 10 of the present embodiment executes image processing such as a print process of forming an image on a sheet, or an image reading process of reading an image from a document sheet. The sheet is a sheet-like image formation medium such as a sheet of paper or a resin film.

In the present embodiment, the image processing apparatus 10 includes an image forming device 10A and an image reading device 10B, wherein the image forming device 10A executes the print process and the image reading device 10B executes the image reading process.

The image processing apparatus 10 further includes a control board 8 that includes a CPU (Central Processing Unit) 81 configured to control the image forming device 10A and the image reading device 10B. The control board 8 includes a board 80 on which the CPU 81 is mounted.

It is noted that the CPU 81 is an example of a control device. The control device may be realized by, instead of the CPU 81, another type of processor such as a DSP (Digital Signal Processor) or a circuit such as an ASIC (Application Specific Integrated Circuit).

Configuration of Image Forming Device 10A

Figure 1:
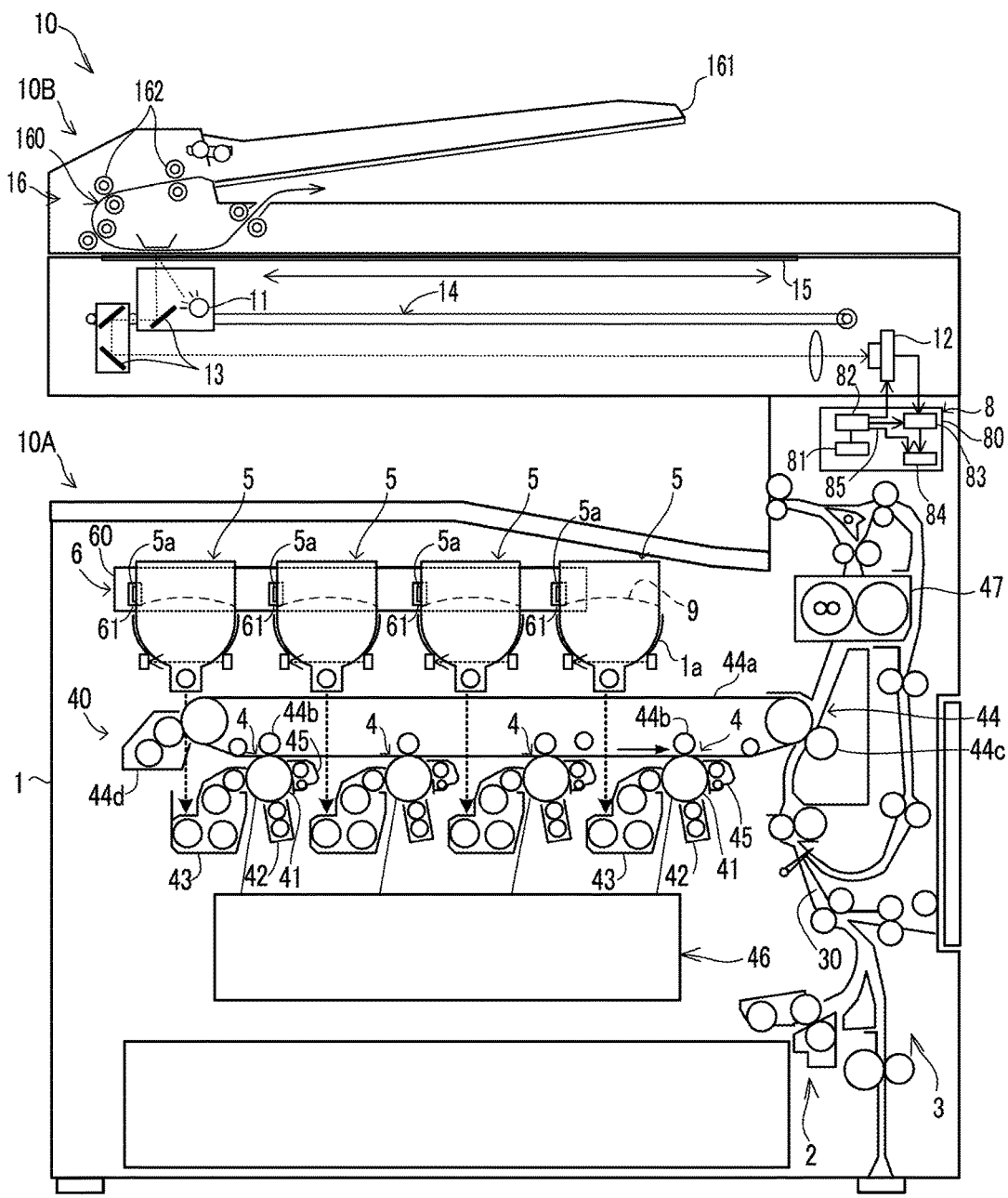
FIG. 1 is a configuration diagram of an image processing apparatus according to an embodiment of the present disclosure.

As shown in FIG. 1, the image forming device 10A includes, in a main body 1, a sheet supply mechanism 2, a sheet conveying mechanism 3, and an image forming portion 40.

In the present embodiment, the image forming portion 40 executes the print process by an electrophotographic system. Accordingly, the image forming portion 40 includes image creating devices 4, a laser scanning unit 46, a transfer device 44, and a fixing device 47. Each of the image creating portions 4 includes a drum-like photoconductor 41, a charging device 42, a developing device 43, and a photoconductor cleaning device 45.

As shown in FIG. 1, the image forming device 10A is a color image forming device including the image forming portion 40 of a tandem type. As a result, the image forming device 10A includes four image creating devices 4 that respectively correspond to colors cyan, magenta, yellow, and black.

Furthermore, the transfer device 44 includes an intermediate transfer belt 44a, four primary transfer devices 44b corresponding to the four image creating devices 4, a secondary transfer device 44c, and a belt cleaning device 44d.

The sheet supply mechanism 2 feeds the sheet to a sheet conveyance path 30 in the main body 1. The sheet conveying mechanism 3 conveys the sheet along the sheet conveyance path 30.

The charging device 42 uniformly charges a surface of the photoconductor 41. The laser scanning unit 46 writes an electrostatic latent image on the surface of the photoconductor 41 by scanning laser light thereon.

The developing device 43 develops the electrostatic latent image on the surface of the photoconductor 41 by powdery developer 9. This allows an image of the developer 9 to be formed on the surface of the photoconductor 41. It is noted that in the present embodiment, the developer 9 is toner.

The primary transfer devices 44b transfer images of the developer 9 from the surfaces of the photoconductors 41 to the intermediate transfer belt 44a. This allows a color image to be formed on the intermediate transfer belt 44a from images of four colors of the developer 9. The photoconductor cleaning devices 45 remove residual developer 9 respectively from the surfaces of the photoconductors 41.

The secondary transfer device 44c transfers the image of the developer 9 from the surface of the intermediate transfer belt 44a to the sheet conveyed along the sheet conveyance path 30. The fixing device 47 fixes the transferred image of the developer 9 on the sheet, to the sheet by heating the image. The belt cleaning device 44d removes residual developer 9 from the intermediate transfer belt 44a.

Furthermore, the image processing apparatus 10 includes four developer containers 5 that respectively store the developer 9 of different colors. The four developer containers 5 can respectively be attached in a detachable manner to four container attachment portions 1a provided in the main body 1. The four developer containers 5 store the developer 9 respectively for supply to the four developing devices 43.

Configuration of Image Reading Device 10B

The image reading device 10B includes a light source 11, an image sensor 12, a light guide device 13, a light source scanning device 14, a document sheet table 15, and an automatic document feeding device 16.

The light source 11 irradiates light on the document sheet. The light guide device 13 guides light reflected on the document sheet to the image sensor 12. The image sensor 12 detects a light amount of the reflected light, and outputs a detection signal representing the detected light amount as an image signal.

The light source scanning device 14 scans the light emitted from the light source 11 on the document sheet placed on the document sheet table 15, by moving the light source 11 along a predetermined sub scanning direction. This allows the image sensor 12 to output the image signal that represents an image read from the document sheet placed on the document sheet table 15.

The automatic document feeding device 16 includes a document sheet tray 161 and a plurality of document feeding rollers 162. The plurality of document feeding rollers 162 feed the document sheet placed on the document sheet tray 161, along a document feeding path 160.

When the automatic document feeding device 16 operates, the light source scanning device 14 holds the light source 11 at a predetermined position, and the light source 11 irradiates light on the document sheet that is moving along the document feeding path 160. This allows the image sensor 12 to output the image signal that represents an image read from the document sheet fed by the automatic document feeding device 16.

It is noted that the light source scanning device 14 operates when the automatic document feeding device 16 does not operate, namely, when no document sheet is placed on the document sheet tray 161.

The control board 8 further includes a timing control circuit 82, an analog front end circuit 83, and an image processing circuit 84 that are formed on the board 80.

The timing control circuit 82 outputs various timing signals to one or more devices including the image sensor 12 of the image reading device 10B in accordance with control commands from the CPU 81 so as to control the timing of the image reading process. The timing control circuit 82 outputs the timing signals to the one or more devices including the image sensor 12, through timing signal lines 85 that are described below. The timing signals are an example of a frequency signal. The frequency signal is a signal that changes at a predetermined, constant frequency, or a signal subjected to frequency modulation.

For example, the timing signals are classified into: a line synchronization signal output to the image sensor 12; a sampling timing signal output to the analog front end circuit 83; and a pixel clock signal output to the image processing circuit 84.

The image sensor 12 reads one line of image from the document sheet in synchronization with the line synchronization signal. The analog front end circuit 83, in synchronization with the sampling timing signal, converts the image signal output from the image sensor 12 to digital image data composed of a plurality of pieces of pixel data.

The image processing circuit 84, in synchronization with the pixel clock signal, acquires the plurality of pieces of pixel data from the analog front end circuit 83, and performs various image calculation processes on the plurality of pieces of pixel data.

Furthermore, the control board 8 includes a plurality of timing signal lines 85 that form a wiring pattern on the board 80. The plurality of timing signal lines 85 electrically connect, to each other, the timing control circuit 82, the image sensor 12, the analog front end circuit 83, and the image processing circuit 84. The control board 8 transmits the timing signals through the plurality of timing signal lines 85.

It is noted that the plurality of timing signal lines 85 are an example of the frequency signal lines. The frequency signal line is a wiring pattern through which the frequency signal is transmitted. For example, the plurality of timing signal lines 85 are formed from a metal foil such as a copper foil.

Electronic Tag 5a and Antenna Board 6

In the image forming device 10A, an electronic tag 5a is attached to each of the developer containers 5. The electronic tag 5a is, for example, a passive-type electronic tag. For example, the electronic tag 5a may be a passive-type RF (Radio Frequency) tag.

The electronic tag 5a includes a computer-readable, non-volatile data storage device. The data storage device stores developer data in advance, wherein the developer data is information of the developer 9 stored in its associated developer container 5, such as the color and type of the developer 9.

Furthermore, the image processing apparatus 10 includes an antenna board 6 that includes four antennas 61 corresponding to the four container attachment portions 1a. The antenna board 6 includes a board 60 and the four antennas 61 formed on the board 60.

Figure 2:
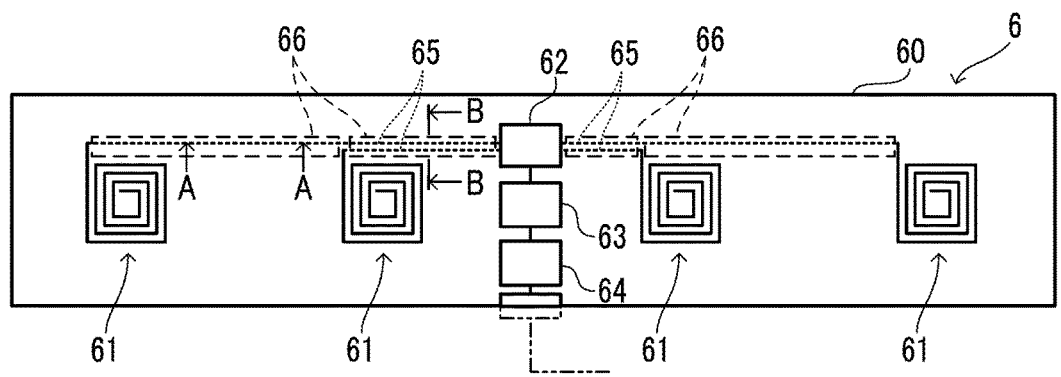
FIG. 2 is a configuration diagram of an antenna board in the image processing apparatus according to the embodiment of the present disclosure.

For example, as shown in FIG. 2, the four antennas 61 may be printed antennas printed on the board 60. Each of the printed antennas is a wiring pattern of a metal foil printed on the board 60 in a coil shape.

The four antennas 61 are configured to transmit and receive radio signals for a short-distance wireless communication to and from the electronic tags 5a attached to the developer containers 5 that are respectively attached to the four container attachment portions 1a. For example, the short-distance wireless communication may be a wireless communication that is performed within a range of less than 100 cm by using a radio wave of a shortwave band of 13.56 Mhz.

As shown in FIG. 2, the antenna board 6 includes a modulation/demodulation circuit 62, a MPU (Micro Processing Unit) 63, and a communication circuit 64 that are mounted on the board 60. In the antenna board 6, the modulation/demodulation circuit 62 and the four antennas 61 are electrically connected to each other via four antenna signal lines 65 formed in the board 60.

The four antenna signal lines 65 are wiring patterns formed in the board 60. For example, the four antenna signal lines 65 are formed from a metal foil such as a copper foil. It is noted that each of the four antenna signal lines 65 is an example of the frequency signal line.

The modulation/demodulation circuit 62, in accordance with a control command from the CPU 81 of the control board 8, outputs transmission frequency signals to the four antennas 61 through the four antenna signal lines 65 respectively. Furthermore, the modulation/demodulation circuit 62 reads data from the electronic tags 5a by receiving reception frequency signals through the four antennas 61 and the four antenna signal lines 65. It is noted that the transmission frequency signal and the reception frequency signal are examples of the frequency signal.

The modulation/demodulation circuit 62 performs a demodulation process on the reception frequency signals, and acquires data represented by the demodulated signals, as the data read from the electronic tags 5a. Furthermore, the modulation/demodulation circuit 62 transmits the data read from the electronic tags 5a to the CPU 81 of the control board 8 via the MPU 63 and the communication circuit 64.

The MPU 63 acquires a control command output from the CPU 81 via the communication circuit 64, and controls the modulation/demodulation circuit 62 in accordance with the acquired control command. For example, upon acquiring a read command from the CPU 81, the MPU 63 causes the modulation/demodulation circuit 62 to output transmission frequency signals that represent the read command. Furthermore, the MPU 63 transmits data read from the electronic tags 5a, to the CPU 81 via the communication circuit 64.

In addition, upon acquiring, from the CPU 81, a write command and write data, the MPU 63 causes the modulation/demodulation circuit 62 to output transmission frequency signals that represent the write command and the write data. This allows the write data to be written on the data storage devices of the electronic tags 5a.

The communication circuit 64 controls transmission and reception of data between the MPU 63 and the CPU 81. The CPU 81 controls the image forming device 10A based on data read from the four electronic tags 5a via the modulation/demodulation circuit 62. For example, the CPU 81 prohibits the image forming device 10A from executing the print process if the read data does not represent a predetermined color of toner or predetermined device type.

As described above, the antenna board 6 is a so-called tag reader/writer that reads and writes data from and to the electronic tags 5a.

Meanwhile, in a printed board such as the antenna board 6 or the control board 8, circuits are desirably collected in a small space, and the EMI that is caused by the frequency signal lines such as the antenna signal lines 65 and the timing signal lines 85, is desirably reduced.

In the image processing apparatus 10, the antenna board 6 and the control board 8 have a structure for collecting circuits in a small space and reducing the EMI that is caused by the frequency signal lines.

Antenna Board 6

Figure 3:
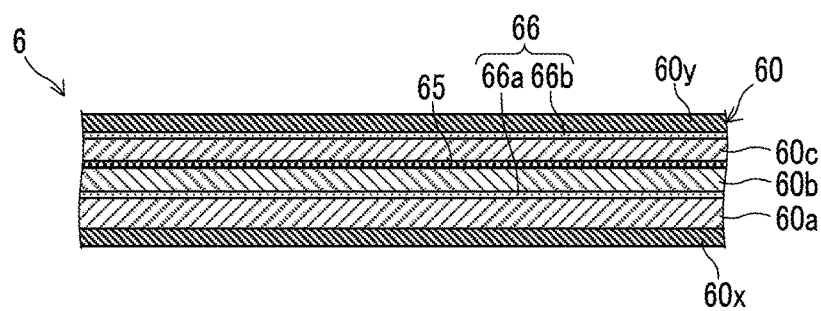
FIG. 3 is a longitudinal sectional view of the antenna board in the image processing apparatus according to the embodiment of the present disclosure.
Figure 4:
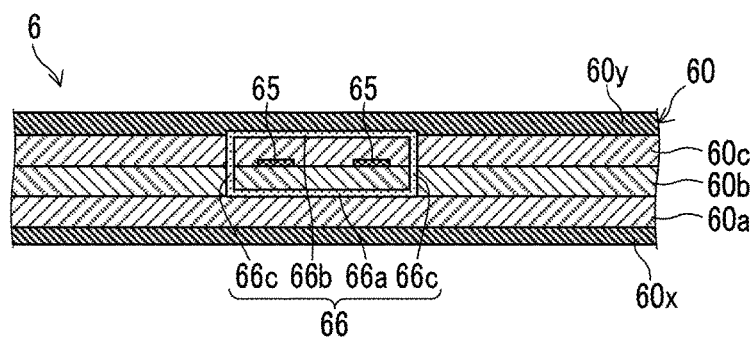
FIG. 4 is a cross-sectional view of the antenna board in the image processing apparatus according to the embodiment of the present disclosure.

FIG. 3 is a cross-sectional view taken along the A-A line in the antenna board 6 shown in FIG. 2. FIG. 4 is a cross-sectional view taken along the B-B line in the antenna board 6 shown in FIG. 2.

As shown in FIG. 3 and FIG. 4, the board 60 of the antenna board 6 is a layered board in which a plurality of base layers 60a, 60b and 60c are laminated. In the example shown in FIG. 3, the board 60 has a structure in which three base layers 60a, 60b and 60c, a rear-surface resist 60x, and a front-surface resist 60y are laminated.

The four antenna signal lines 65 are wiring patterns printed on the base layer 60b that is an intermediate layer of the board 60.

The antenna board 6 includes a cylindrical magnetic body 66 formed to extend along the antenna signal lines 65 and surround a circumference of the antenna signal lines 65. The cylindrical magnetic body 66 includes a lower portion 66a, an upper portion 66b, and a pair of side portions 66c.

In the board 60, the lower portion 66a is formed on an upper surface of the base layer 60a that is located under the base layer 60b which is an intermediate layer on which the antenna signal lines 65 are formed. The upper portion 66b is formed on an upper surface of the base layer 60c that is, in the thickness direction of the board 60, located on the intermediate layer 60b on which the antenna signal lines 65 are formed.

The pair of side portions 66c connect the lower portion 66a and the upper portion 66b at opposite sides of the antenna signal lines 65. The pair of side portions 66c are formed by an etching process performed on the intermediate layer 60b and the base layer 60c located on the intermediate layer 60b.

The cylindrical magnetic body 66 is a magnetic body electrically insulated from the antenna signal lines 65 by the intermediate layer 60b and the base layer 60c in the board 60. For example, the material of the cylindrical magnetic body 66 may be ferrite. In addition, the material of the cylindrical magnetic body 66 may be iron oxide or chromium oxide.

In the example shown in FIG. 4, one cylindrical magnetic body 66 surrounds, in a batch, two antenna signal lines 65 in a range in which the two antenna signal lines 65 are parallel to each other. For example, the two antenna signal lines 65 surrounded by the cylindrical magnetic body 66 may be formed on the same intermediate layer 60b (see FIG. 4).

Control Board 8

Figure 5:
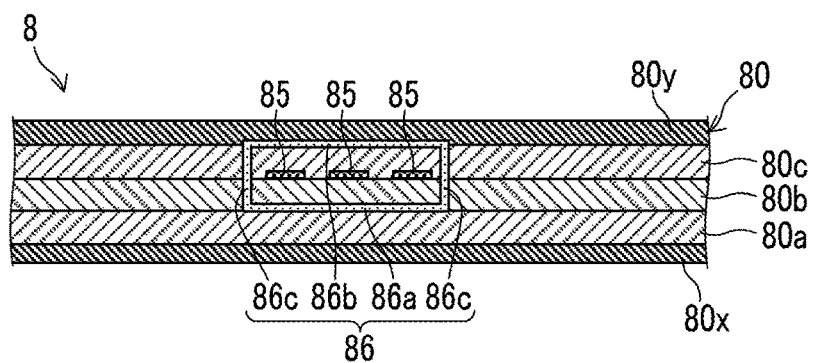
FIG. 5 is a cross-sectional view of a control board in the image processing apparatus according to the embodiment of the present disclosure.

As shown in FIG. 5, the board 80 of the control board 8 is also a layered board in which a plurality of base layers 80a, 80b, and 80c are laminated. In the example shown in FIG. 5, the board 80 has a structure in which three base layers 80a, 80b and 80c, a rear-surface resist 80x, and a front-surface resist 80y are laminated.

The three timing signal lines 85 are wiring patterns printed on the base layer 80b which is an intermediate layer of the board 80.

The control board 8, as is the case with the antenna board 6, includes a cylindrical magnetic body 86 that is formed to extend along the timing signal lines 85 and surround a circumference of the timing signal lines 85. The cylindrical magnetic body 86 also includes a lower portion 86a, an upper portion 86b, and a pair of side portions 86c.

In the board 80, the lower portion 86a is formed on an upper surface of the base layer 80a that is located under the intermediate layer 80b on which the timing signal lines 85 are formed. The upper portion 86b is formed on an upper surface of the base layer 80c that is, in the board 80, formed on the intermediate layer 80b on which the timing signal lines 85 are formed.

The pair of side portions 86c connect the lower portion 86a and the upper portion 86b at opposite sides of the timing signal lines 85.

The cylindrical magnetic body 86 is a magnetic body electrically insulated from the timing signal lines 85 by the intermediate layer 80b and the base layer 80c in the board 80. The material of the cylindrical magnetic body 86 is the same as that of the cylindrical magnetic body 66.

In the example shown in FIG. 5, one cylindrical magnetic body 86 surrounds, in a batch, three timing signal lines 85 in a range in which the three timing signal lines 85 are parallel to each other. For example, the three timing signal lines 85 surrounded by the cylindrical magnetic body 86 may be formed on the same intermediate layer 80b (see FIG. 5).

The cylindrical magnetic bodies 66 and 86 function as electromagnetic shield members respectively in the antenna board 6 and the control board 8. The cylindrical magnetic bodies 66 and 86 do not leak electromagnetic waves in any circumferential directions of the antenna signal lines 65 and the timing signal lines 85.

In addition, in the antenna board 6 and the control board 8, the cylindrical magnetic bodies 66 and 86 can be formed compact at positions close to the antenna signal lines 65 and the timing signal lines 85 respectively.

Furthermore, the cylindrical magnetic body 66 surrounds, in a batch, a plurality of antenna signal lines 65 in a range in which the antenna signal lines 65 are parallel to each other, and the cylindrical magnetic body 86 surrounds, in a batch, a plurality of timing signal lines 85 in a range in which the timing signal lines 85 are parallel to each other. This makes it possible to narrow the interval between the plurality of antenna signal lines 65 and the interval between the plurality of timing signal lines 85, and collect the circuits of the antenna board 6 and the control board 8 in more compact spaces.

As a result, with adoption of the image processing apparatus 10, it is possible to collect the circuits of the antenna board 6 and the control board 8 in small spaces, and reduce the EMI that is caused by the plurality of antenna signal lines 65 and the plurality of timing signal lines 85.

Application Example

Figure 6:
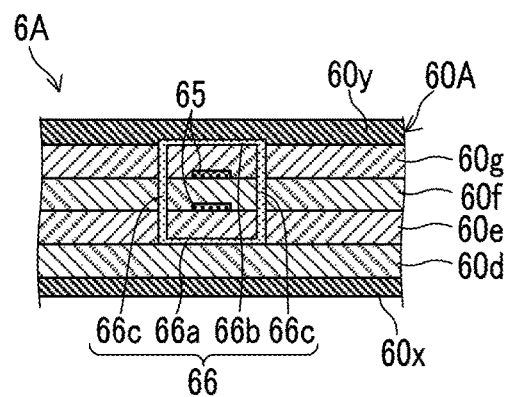
FIG. 6 is a cross-sectional view of an antenna board according to an application example.

In the following, a description is given of differences of an antenna board 6A according to an application example, from the antenna board 6. In FIG. 6, components that are the same as those shown in FIG. 3 and FIG. 4 are assigned the same reference signs.

As shown in FIG. 6, a board 60A of the antenna board 6A is a layered board having a structure where four base layers 60d, 60e, 60f and 60g, the rear-surface resist 60x, and the front-surface resist 60y are laminated. Accordingly, the board 60A includes two intermediate layers 60e and 60f.

In the antenna board 6A, two antenna signal lines 65 are formed respectively on the two intermediate layers 60e and 60f so as to be in alignment in an up-down direction. It is noted that the up-down direction is the thickness direction of the board 60A.

In the present application example, the cylindrical magnetic body 66 surrounds, in a batch, two antenna signal lines 65 in a range in which the two antenna signal lines 65 are formed respectively on the two intermediate layers 60e and 60f so as to be parallel to each other in the thickness direction. Accordingly, the pair of side portions 66c of the cylindrical magnetic body 66 of the present application example are formed by an etching process performed on the two intermediate layers 60e and 60f and the base layer 60g that is located on the intermediate layer 60f.

When the present application example is adopted, the same effect is produced as when the above-described embodiment is adopted. Furthermore, with adoption of the present application example, it is possible to reduce the space in which circuits of the antenna board 6A are collected.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:
1. An image processing apparatus comprising:
an image forming device configured to execute a print process of forming an image on a sheet, or an image reading device configured to execute an image reading process of reading an image from a document sheet; and a print board including a layered board and one or more frequency signal lines that are wiring patterns formed on an intermediate layer of the layered board, the print board transmitting, through the one or more frequency signal lines, frequency signals concerning the print process or the image reading process, wherein the print board further includes a cylindrical magnetic body that includes a lower portion, an upper portion, and a pair of side portions, the lower portion and the upper portion being respectively formed on layers of the layered board that are, in a thickness direction of the print board, located under and on the intermediate layer on which the one or more frequency signal lines are formed, the pair of side portions connecting the lower portion and the upper portion at opposite sides of the one or more frequency signal lines, the cylindrical magnetic body being formed in a shape of a cylinder in such a way as to extend along the one or more frequency signal lines and surround a circumference of the one or more frequency signal lines, the cylindrical magnetic body being electrically insulated from the one or more frequency signal lines by the layered board.

2. The image processing apparatus according to claim 1, further comprising:

a plurality of developer containers storing developer and being attached to a container attachment portion of an apparatus main body in a detachable manner, the developer being supplied to the image forming device;

a plurality of electronic tags respectively attached to the plurality of developer containers; and a control device configured to control the image forming device based on data read from the plurality of electronic tags, wherein the print board includes:
a plurality of the frequency signal lines;
a modulation/demodulation circuit electrically connected to the plurality of the frequency signal lines; and
a plurality of antennas electrically connected to the modulation/demodulation circuit through the plurality of the frequency signal lines, and configured to transmit and receive radio signals to and from the plurality of electronic tags, the modulation/demodulation circuit, in accordance with a control command from the control device, outputs transmission frequency signals to the plurality of antennas through the plurality of the frequency signal lines, reads data from the electronic tags by receiving reception frequency signals through the plurality of antennas and the plurality of the frequency signal lines, and transmits the data read from the electronic tags to the control device, and the cylindrical magnetic body surrounds, in a batch, the plurality of the frequency signal lines in a range in which the plurality of the frequency signal lines are parallel to each other.

3. The image processing apparatus according to claim 2, wherein the plurality of the frequency signal lines are formed on a plurality of the intermediate layers in the layered board, and the cylindrical magnetic body surrounds, in a batch, the plurality of the frequency signal lines formed on the plurality of the intermediate layers, in a range in which the plurality of the frequency signal lines are parallel to each other.

4. The image processing apparatus according to claim 1, further comprising:

a control device configured to control the image reading device, wherein the print board includes:
a plurality of the frequency signal lines electrically connected to one or more devices including the image reading device; and
a timing control circuit electrically connected to the one or more devices including the image reading device through the plurality of the frequency signal lines, and configured to output frequency signals to the one or more devices including the image forming device or the image reading device in accordance with control commands from the control device so as to control timing of the image reading process, the timing control circuit outputting the frequency signals through the plurality of the frequency signal lines, and the cylindrical magnetic body surrounds, in a batch, the plurality of the frequency signal lines in a range in which the plurality of the frequency signal lines are parallel to each other.

5. The image processing apparatus according to claim 4, wherein the plurality of the frequency signal lines are formed on a plurality of the intermediate layers in the layered board, and the cylindrical magnetic body surrounds, in a batch, the plurality of the frequency signal lines formed on the plurality of the intermediate layers, in a range in which the plurality of the frequency signal lines are parallel to each other.

* * * * *